US009800232B2

(12) United States Patent
Franch et al.

(10) Patent No.: US 9,800,232 B2
(45) Date of Patent: *Oct. 24, 2017

(54) STITCHABLE GLOBAL CLOCK FOR 3D CHIPS

(71) Applicant: INTERNATIONAL BUSINESS MACHINES CORPORATION, Armonk, NY (US)

(72) Inventors: Robert L. Franch, Wappingers Falls, NY (US); Eren Kursun, Yorktown Heights, NY (US); Liang-Teck Pang, White Plains, NY (US); Phillip J. Restle, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/085,294

(22) Filed: Mar. 30, 2016

(65) Prior Publication Data

US 2016/0211833 A1 Jul. 21, 2016

Related U.S. Application Data

(63) Continuation of application No. 14/318,951, filed on Jun. 30, 2014, now Pat. No. 9,348,357.

(51) Int. Cl.
*G06F 1/08* (2006.01)
*H03K 5/05* (2006.01)
*G06F 1/32* (2006.01)

(52) U.S. Cl.
CPC ............... *H03K 5/05* (2013.01); *G06F 1/08* (2013.01); *G06F 1/32* (2013.01)

(58) Field of Classification Search
USPC .................. 327/291–293, 564, 565
See application file for complete search history.

(56) References Cited

U.S. PATENT DOCUMENTS

| 7,772,888 B2 | 8/2010 | Ciccarelli et al. |
| 8,270,231 B2 | 9/2012 | Oberlaender et al. |

(Continued)

FOREIGN PATENT DOCUMENTS

| JP | 2006134215 | 5/2006 |
| JP | 2012043327 | 3/2012 |

OTHER PUBLICATIONS

List of IBM Patents or Patent Applications Treated as Related dated Mar. 30, 2016, 2 pages.

(Continued)

*Primary Examiner* — An Luu
(74) *Attorney, Agent, or Firm* — Tutunjian & Bitetto, P.C.; Rabin Bhattacharya (57) ABSTRACT

A method for providing a stitchable clock mesh, a dual operation mode system, and a method for providing a master clock stratum are, in turn, provided for a 3D chip stack having two or more strata. The method for providing a stitchable clock mesh includes providing, by at least one clock mesh disposed on each stratum and having multiple sectors, a global clock signal to various chip locations. The method further includes collecting, by mesh data sensors on each stratum, mesh data for the at least one mesh. The mesh data includes measured functional data and measured performance data for a current system configuration. The method also includes selectively performing, by joining circuitry, a segmentation operation or a joining operation on the least one mesh or one or more portions thereof responsive to the mesh data and the current system configuration selectable from a plurality of system target configurations.

20 Claims, 7 Drawing Sheets

(56) References Cited

U.S. PATENT DOCUMENTS

| | | | |
|---|---|---|---|
| 8,587,357 B2 * | 11/2013 | Kim | G06F 1/26 327/292 |
| 2007/0092011 A1 | 4/2007 | Ciccarelli et al. | |
| 2009/0199143 A1 | 8/2009 | Schlotman et al. | |
| 2010/0070941 A1 | 3/2010 | Sircar et al. | |
| 2011/0063000 A1 | 3/2011 | Sunkavalli et al. | |
| 2011/0209112 A1 | 8/2011 | Laub | |

OTHER PUBLICATIONS

Chan, S., et al. "A Resonant Global Clock Distribution for the Cell Broadband Engine Processor" IEEE Journal of Solid-State Circuits, vol. 44, No. 1, Jan. 2009. pp. 64-72.
Diamantopoulos, S., et al. "Framework for performing rapid evaluation of 3D SoCs" Electronics Letters, vol. 48 No. 12. Jun. 2012. (2 Pages).
Hua, H., et al. "Exploring Compromises among Timing, Power and Temperature in Three-Dimensional Integrated Circuits" 43rd ACM/IEEE Design Automation Conference, Jul. 2006. pp. 997-1002.
Pang, L-T., et al. "A Shorted Global Clock Design for Multi-GHz 3D Stacked Chips" 2012 Symposium on VLSI Circuits Digest of Technical Papers, Jun. 2012. pp. 170-171.
Zhao, X., et al. "Low-Power Clock Tree Design for Pre-Bond Testing of 3-D Stacked ICs" IEEE Transactions on Computer-Aided Design of Integrated Circuits and Systems, vol. 30, No. 5, May 2011. pp. 732-745.

* cited by examiner

STITCHABLE GLOBAL CLOCK FOR 3D CHIPS

BACKGROUND

Technical Field

The present invention relates generally to integrated circuits and, in particular, to a re-configurable or stitchable global clock for 3D chips.

Description of the Related Art

A three-dimensional (3D) stacked chip includes two or more electronic integrated circuit chips (referred to as strata or stratum) stacked one on top of the other. The strata are connected to each other with inter-strata interconnects that could use C4 or other technology, and the strata could include through-Silicon vias (TSVs) to connect from the front side to the back side of the strata. The strata could be stacked face-to-face or face-to-back where the active electronics can be on any of the "face" or "back" sides of a particular stratum.

3D integration provides modularity advantages in designing 3D systems from smaller building blocks. It enables the integration of a variety of layers/designs from different manufacturers/design-houses. In order to enable the modularity some infrastructure components such as clocking, pervasives, and power delivery are needed. However, current clock methodologies are targeted towards specific designs.

In modular 3D integration, device layers and IP blocks can come from different wafers from different semiconductor fabrication plants with significant process variations. Determining the optimal configuration at design time is inefficient, since actual silicon performance of the blocks is not available or highly uncertain. 3D integration provides new 3D clocking opportunities for low-skew synchronous clocking of blocks on different chips, but also imposes new 3D constraints such as to 3D power-supply interactions, 3D thermal interactions, and 3D input/output (I/O) limitations.

SUMMARY

According to an aspect of the present principles, a method is provided. The method, in turn, is for providing a stitchable clock mesh for a 3D chip stack having two or more strata. The method includes providing, by at least one clock mesh disposed on each of the two or more strata and having a plurality of sectors, a global clock signal to various chip locations. The method further includes collecting, by mesh data sensors on each of the two or more strata, mesh data for the at least one mesh. The mesh data includes measured functional data and measured performance data for a current system configuration. The method also includes selectively performing, by mesh segmentation and joining circuitry, a segmentation operation or a joining operation on the least one mesh or one or more portions thereof responsive to the mesh data and the current system configuration selectable from a plurality of system target configurations.

According to another aspect of the present principles, a system is provided. The system, in turn, is for providing a dual operation mode in 3D chip stack having two or more strata. The system includes an independent operation mode, wherein each of the two or more strata operate independently and without inter-strata synchronous communication there between. The system further includes an integrated operation mode with inter-strata communication between the two or more strata through inter-strata interconnects. The system also includes a controller for selectively enabling any of the independent operation mode and the integrated operation mode.

According to yet another aspect of the present principles, a method is provided. The method, in turn, is for providing a master clock stratum for a 3D chip stack including two or more strata. The method includes providing, by a power supply portion, power supplying connections. The method further includes providing, by a clock portion, clock supplying connections. The method also includes performing, by pervasive components, pervasive chip functions. The method additionally includes selectively providing, by a controller, to other ones of the two or more strata, at least one of the power supplying connections, the clock supplying connections, and the pervasive chip functions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a reconfigurable or stitchable (hereinafter stitchable) global clock for 3D chips. The stitchable global clock advantageously provides an infrastructural clock design for modular integration of 3D systems.

In IC chips, the clock distribution network is locked in at design time, allowing for no further change or adaptation to circuit components. This is particularly undesirable in 3D chips, since IP blocks can be obtained from different vendors or design houses with different clock frequency requirements. Running all the IP blocks at the limiting frequency of the slowest IP block is extremely sub-optimal and may not meet system performance requirements. Advantageously, the present principles provide a structure and method for dynamically configuring a clock distribution for 3D chips at run-time, after the silicon has been fabricated.

In this structure and method, a controller determines the set of circuit blocks to be activated, in terms of the functional requirements of the 3D system. This results in a target clocking configuration, or the appropriate set of select signals for the 3D multiplexers to achieve the target clocking configuration. The 3D system is then configured to this target clock configuration and run. Functional and performance data is then measured from circuits within each clock domain, or mesh (called mesh data). If the system functional and performance requirements are met, then this target clocking configuration is used. If not met, the process iterates, and the controller determines an alternate clocking configuration. This loop is repeated until the system functional and performance requirements are met.

As noted above, there is a need for optimal modular 3D clocking structures in the presence of significant variation of the IP blocks. Given the variation of the IP blocks, we advantageously propose a controller that chooses the optimal clocking configuration (shorted meshes, sync or async, vertically and laterally).

Further, the present principles advantageously provide a reconfigurable 3D clocking structure wherein multiple clock distributions are stitchable from layer to layer based on desired function and/or performance, targeted toward multiple IP blocks from, e.g., multiple vendors or multiple semiconductor fabrication plants with differing process variations.

Figure 1:
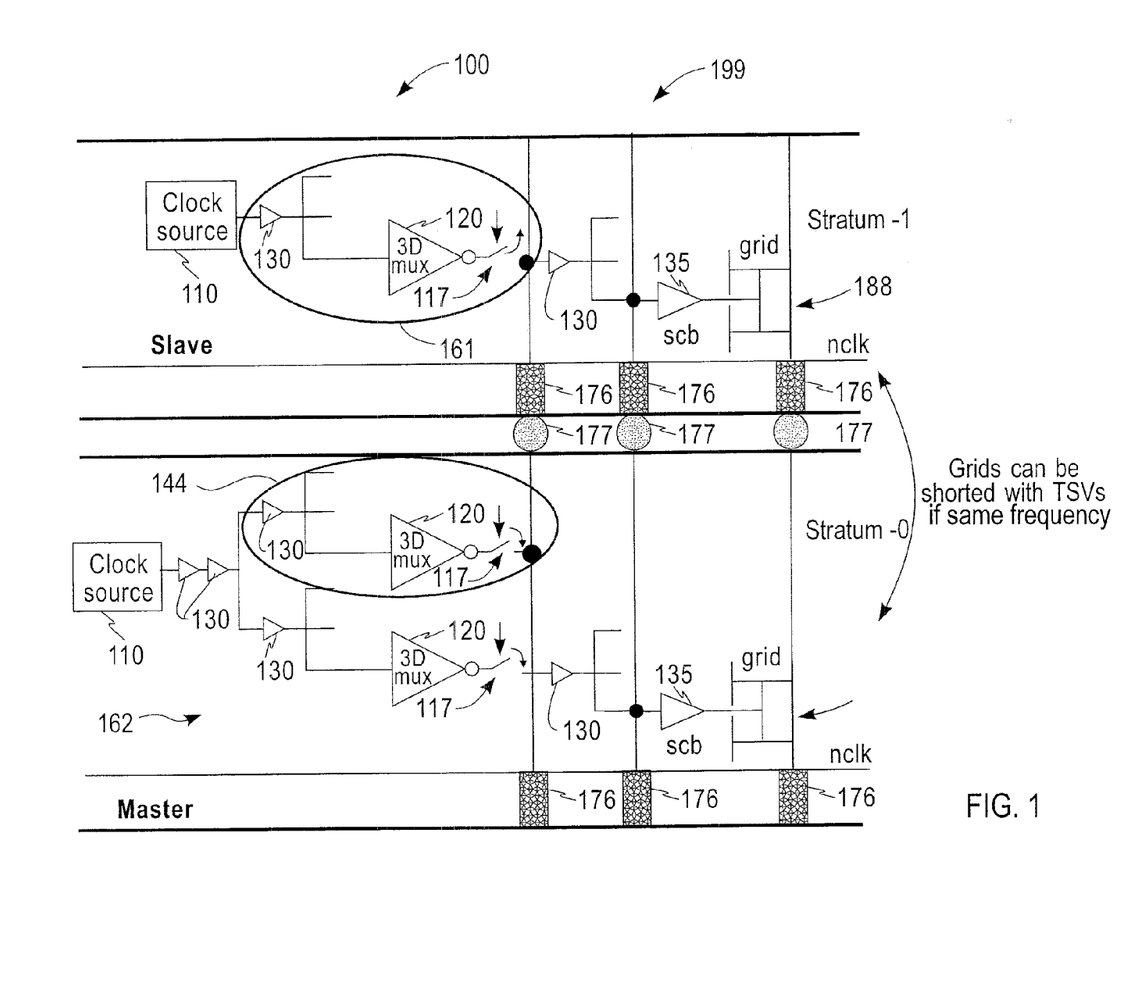
FIG. 1 shows a tree replication 144 by a master stratum 162, in accordance with an embodiment of the present principles.

FIG. 1 shows a tree replication 144 by a master stratum 110 in a 3D stack 199, in accordance with an embodiment of the present principles. 3D muxes 120 in all strata have the same size. The tree replication relates 144 to a clock distribution network 133 for the 3D chip stack 199. The clock distribution network 133 includes shorted clock trees 100. Clock distributions can be shorted at various points in the distribution to reduce skew, if they are on the same frequency. Each stratum of the stack 199 includes a one or more of the shorted clock trees 100. Stack 199 includes a stratum-0 and a stratum-1. Stratum-0 is also referred to as master stratum 162.

The shorted clock trees 100 have a single clock source 110 (e.g., a phase locked loop (PLL)), selectable using a 3D mux 120, for driving the clock trees in all strata. Clock buffers 130 on all strata are shorted together using through-Silicon vias (TSVs) 176 and micro C4 connections (μC4) 177. Inputs of the clock buffers 130 in the trees 100 are shorted, and uniform shorting is applied over the entire final clock mesh (nclk) 188. We note that the "final clock mesh" is interchangeably referred to herein as "final clock grid" as well as "nclk" and, hence, all are denoted by the reference numeral 188.

It is to be appreciated that a set of 3D muxes can also be placed further up the clock tree, at the input to all the relay buffers or sector buffers at the same level of the clock tree instead of placing one 3D mux at the root of the clock tree. The 3D muxes on 0 stratum will then drive the 3D muxes in the other strata which will, in turn, drive the clock tree of that stratum. When the 3D mux is located at the input to the sector buffer, we call that a muxable sector buffer. The same buffer levels in the part of the clock tree from the 3D muxes to the clock grid can be shorted between strata.

The trees 100 provide a low skew and permits testing of individual strata before bonding. The trees 100 should have the same clock frequency in each stratum. The size of the 3D mux 120 scales with number of strata. Dissimilar clock loads and different chip areas in each stratum will cause the skew to increase due to such variations. Inputs rather than outputs of clock buffers 130 in the trees 100 are shorted to avoid strong short-circuit currents and waveform deformation. We note that reducing the amount of inter-stratum shorting will increase the amount of clock skew.

Not shorting the final clock mesh 188 (shorting all other levels of the clock trees) between strata reduces within-stratum local skew at the cost of increased stratum-to-stratum skew. Not shorting the inputs to all sector buffers 135 (shorting all other levels of the clock trees 100 including the final clock mesh 188) will reduce the number of shorting points (TSV and μC4 overheads) significantly (by around 30%) at the cost of a small increase in clock skew. Redundant TSV/μC4 176/177 is added at the corners and edges of the chip or in areas with existing high within-stratum skew to improve robustness as these areas are more sensitive to TSV/uC4 yield. If possible, strata of the same corner are stacked to reduce skew. We note that a number of sector buffers are uniformly distributed over the clock mesh and used to drive the final clock mesh 188 and each sector buffer is placed in the middle of a small rectangular area of the mesh called a clock sector, while a relay buffer (or simply "buffer" in short) 130 is primarily used to relay and/or otherwise distribute the clock signal throughout the chip with the same latency in order to drive the inputs of all the sector buffers in a synchronous manner.

The partial clock trees 161 of the different strata can be replicated on one master stratum 162 and used to drive the tri-state node 117 at the output of the 3D muxes 120 of all strata. In this case, each 3D mux 120 is sized to drive only the last buffer stage and TSV/uC4 176/177. Differences in the load seen by the bidirectional node 117 of the 3D mux 120 before and after stacking do not affect the skew. The tree replication 144 allows for different clock loads and chip areas in each stratum.

Thus, in an embodiment, the present principles can utilize a master clock layer. Advantageously, a master clock layer can provide a clock source or clock reference to all the other layers. Moreover, a master clock layer can function as a glue interface between layers to enable seamless inter-layer communications. Further, if the layers do not have to be tested before 3D stacking, the master clock layer can include all the global clock trees leaving more area in the other layers.

Figure 2:
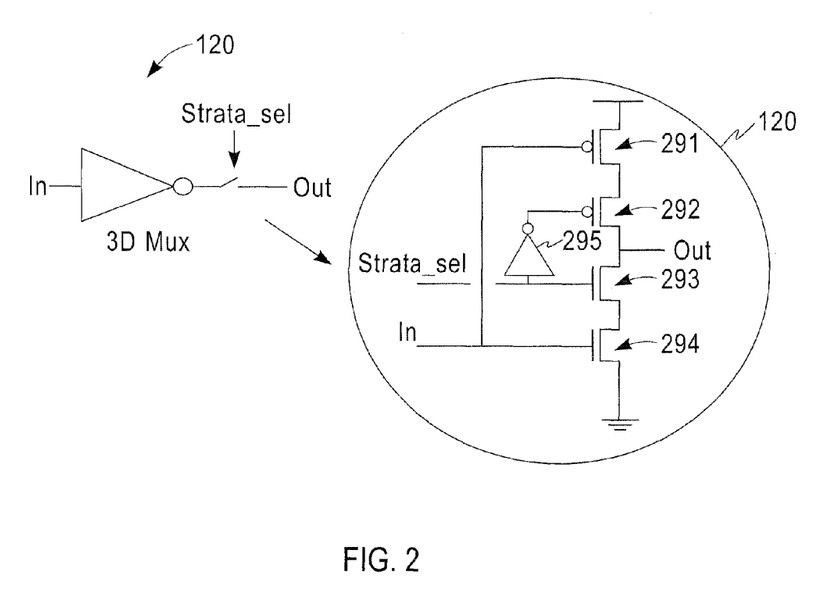
FIG. 2 further shows the 3D multiplexer 120 of FIG. 1, in accordance with an embodiment of the present principles.

FIG. 2 further shows the 3D multiplexer 120 of FIG. 1, in accordance with an embodiment of the present principles. The 3D multiplexer 120 is a tri-state multiplexor that is sized appropriately to drive all the strata in the stack. Its drive strength can be made programmable so that it can have the right drive for testing before stacking or when it is stacked with a variable number of strata. The multiplexer 120 includes two p-channel MOSFETs 291 and 292, two n-channel MOSFETS 293 and 294, and an inverter 295. The source of MOSFET 291 is connected in signal communication with a voltage or current source. The drain of MOSFET 291 is connected in signal communication with the source of MOSFET 292. The source of MOSFET 294 is connected in signal communication with ground. The drain of MOSFET 294 is connected in signal communication with the source of MOSFET 293. An output of the inverter 295 is connected in signal communication with the gate of the MOSFET 292. The drains of MOSFETs 292 and 293 are available as outputs of the 3D multiplexer 120, for providing an output signal ("out"). The gates of the MOSFETS 291 and 294 are available as inputs of the 3D multiplexer 120, for receiving an input signal ("in"). The gate of MOSFET 293 and an input of inverter 295 are available as inputs of the 3D multiplexer 120, for receiving a control signal ("strata_sel").

Figure 3:
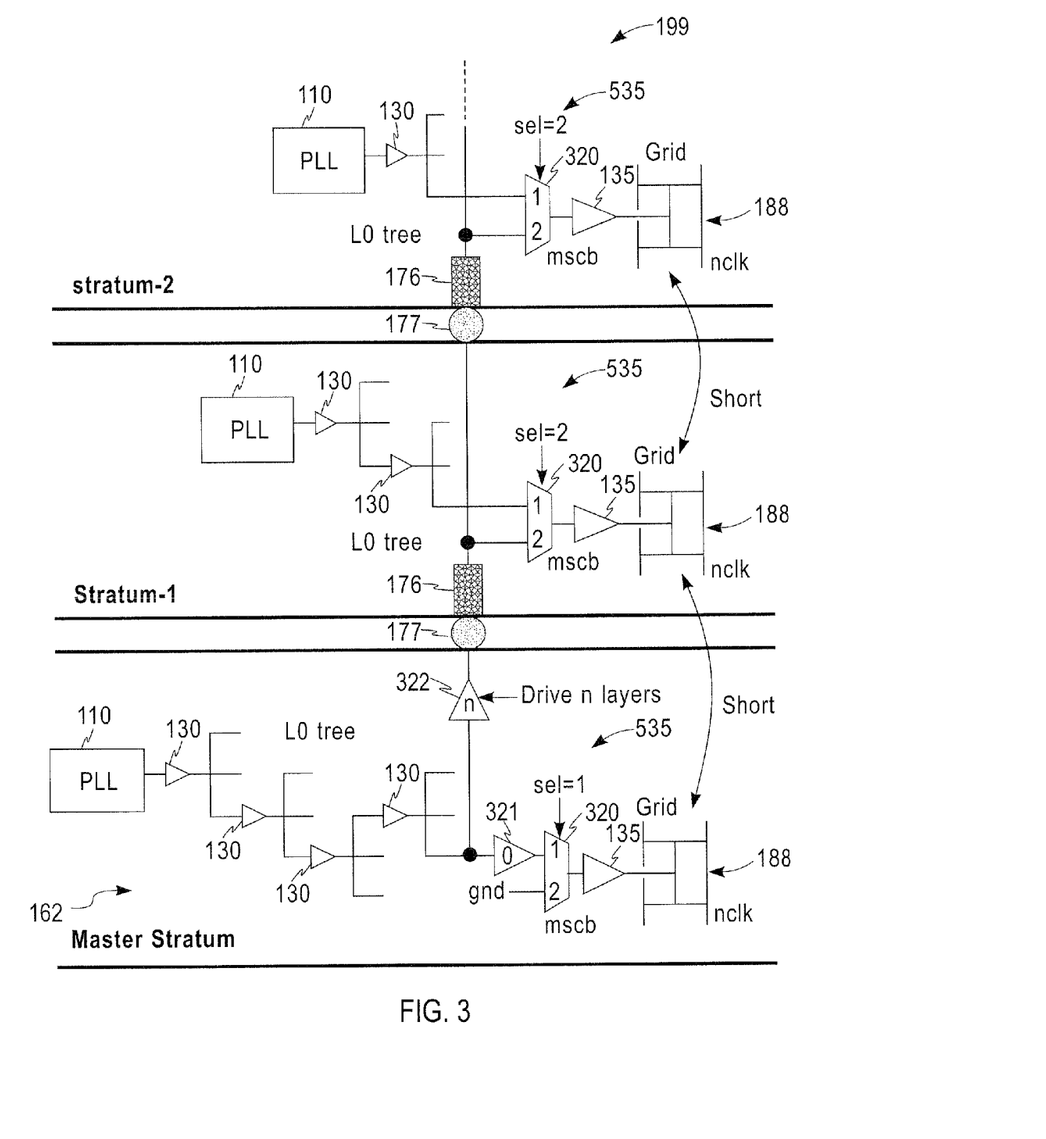
FIG. 3 shows the master stratum 162 of FIG. 1 driving all strata, in accordance with an embodiment of the present principles.
Figure 5:
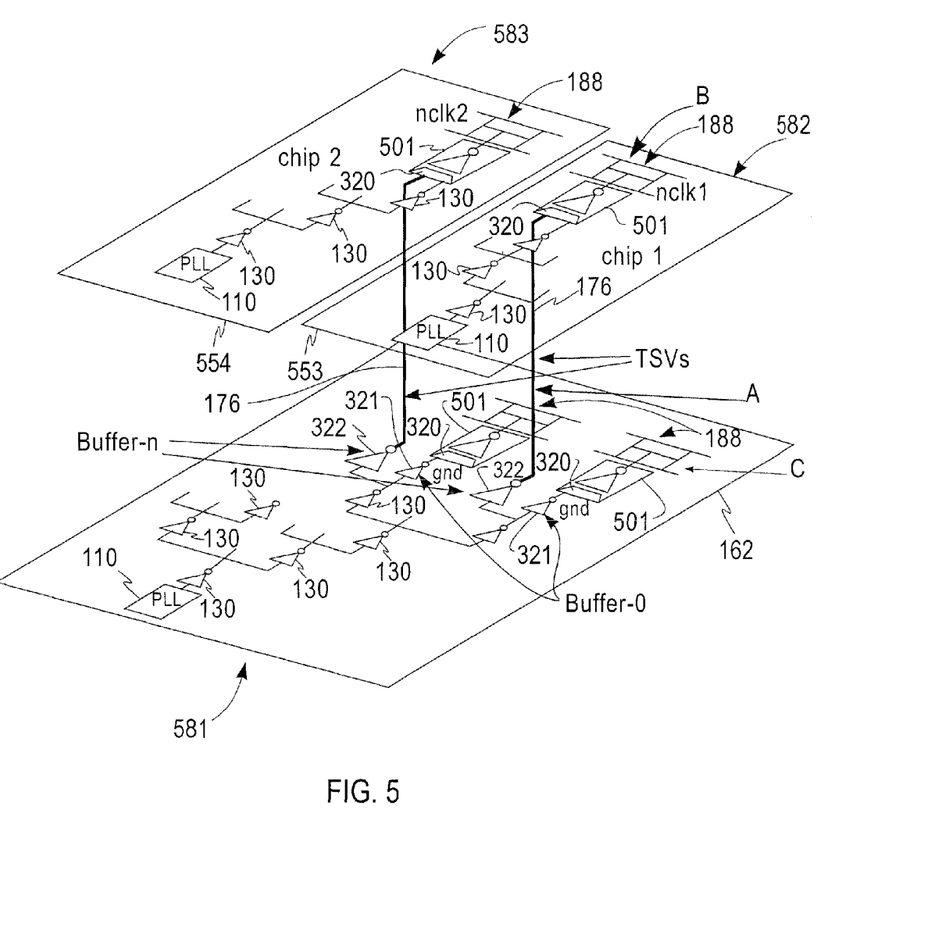
FIG. 5 further shows the master stratum 162 of FIG. 1, in accordance with an embodiment of the present principles.

FIG. 3 and FIG. 5 shows the master stratum 162 of FIG. 1 driving all strata, in accordance with an embodiment of the present principles. The multiplexor here uses a static 2-input mux 320 instead of a tri-state 3D mux. Master stratum 162 includes 2 additional buffers, namely buffer-0 321 and buffer-n 322. Buffer-n 322 can be programmed to drive 1-*n* strata above the master stratum 162 with the same delay as buffer-0 321. The static mux on the master stratum 162 is used to generate the same delay as the static mux of other strata. Strata 1 to n include the static mux without buffer-0 321 and buffer-n 322. The delay from the inputs of buffers-0 321 and buffers-n 322 to the clk grid 188 will be the same for all strata. The clock grid 188 can be shorted to reduce skew further. The approach shown in FIG. 3 is for stacking chips with different clock trees, clock loads and chip areas. Although FIG. 3 shows the static mux placed at the input of the sector buffers, it can be moved further away from the clock grid 188 to the relay buffer levels. In all cases, the clock network between strata on levels after the static muxes 320 can be shorted together to reduce skew if the clock frequencies are the same on the strata. The static mux 320 can also be replaced by a tri-state mux.

Figure 4:
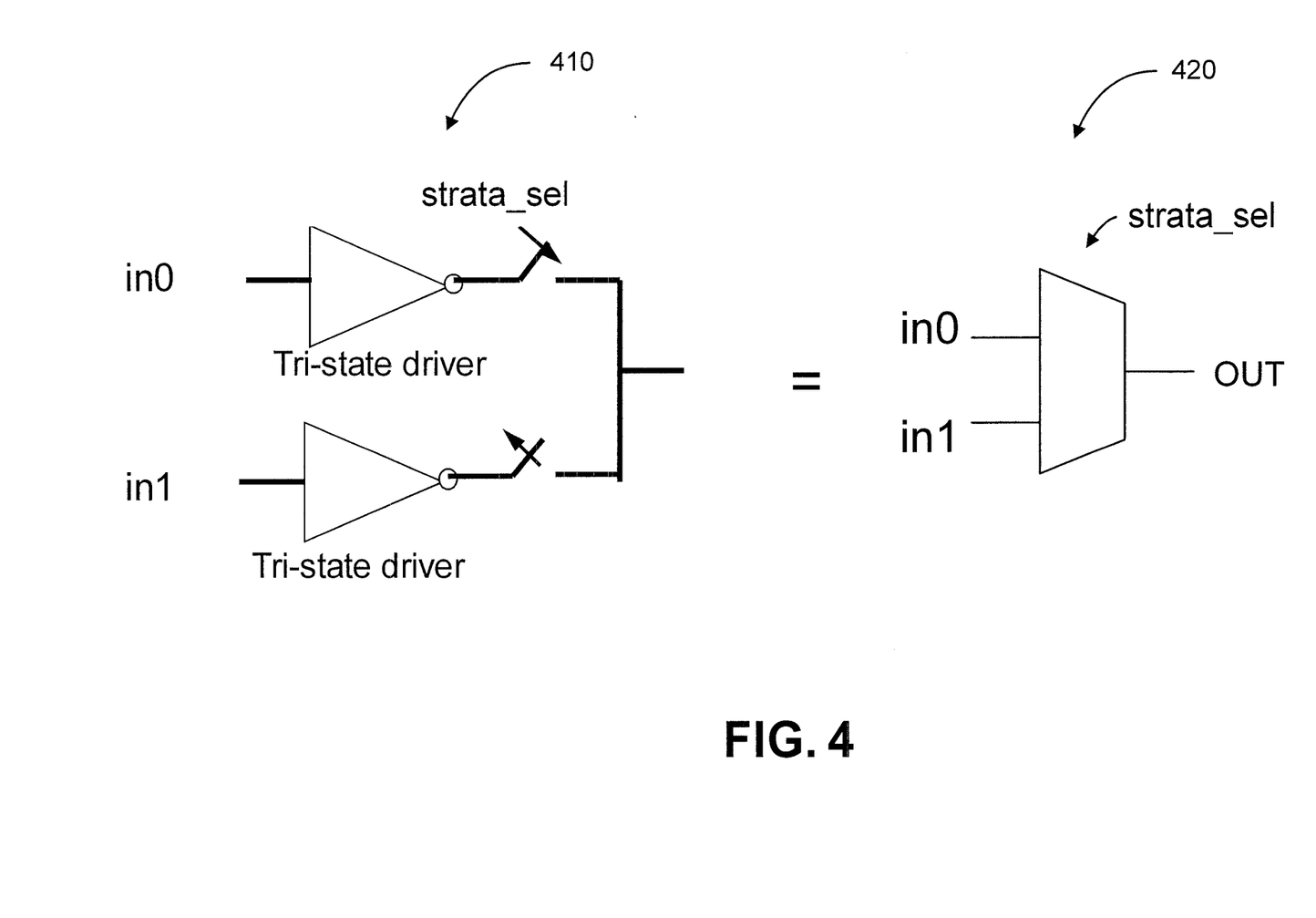
FIG. 4 shows the correlation between a tri-state 3D multiplexer 410 and a static CMOS 2:1 3D multiplexer 420, in accordance with an embodiment of the present principles.

FIG. 4 shows the correlation between a tri-state 3D multiplexer 410 and a static CMOS 2:1 3D multiplexer 420, in accordance with an embodiment of the present principles. The tri-state mux 410 allows for selection of any stratum to drive the others. Moreover, only one TSV link is required for a tri-state mux 410. Regarding the static mux 420, to allow the selection of any stratum to drive the others will require the following: the number of mux inputs=the number of strata=the number of TSV links. However, a 2-input static mux is generally smaller than a tri-state mux. Further, there are no issues with the floating (tri-state) node at startup. The tri-state node can be floating at a non-determined voltage level at startup which can cause reliability issues. Thus, in accordance with an embodiment of the present principles, using a fixed master stratum to drive the clock-tree of all other strata allows for the use of a 2-input static mux 420.

FIG. 5 further shows the master stratum 162 of FIG. 1, in accordance with an embodiment of the present principles. The approach in accordance with the present principles relating to a master stratum as described here can be used for 1-1 stacks or an active Silicon carrier master stratum that has several chip stacks spread over it. The master stratum configuration as disclosed herein provides a low skew even if the stacked chips 553 and 554 do not cover all of the master stratum 162 since the delays of shorted and non-shorted clock buffers are equalized. Static CMOS multiplexers (muxes) 501 select either the clock from the local stratum or the clock from another stratum. Alternately, the muxes 501 can be formed from a dotted pair of tri-state drivers with complementary selects as shown in FIG. 4.

When stacked, the multiplexors 320 in the strata stacked on top of the master stratum 162 can choose to relay a clock signal to the clock grid 188 that they respectively drive by choosing to be driven by the master stratum 162. Alternatively, the multiplexers 320 can choose to disable the clock grid 188 that they respectively drive by choosing to be driven by the clock driver from its own stratum which will be in a fixed voltage level since the clock source (PLL) 110 in its stratum will be disabled and the output fixed at either the power supply voltage or at ground voltage.

The above structures shown in FIGS. 1-4 relate to the problem of testing chips separately, then using a Master and Slave configuration to reduce skew in the stack. Advantageously, the present principles describe how to use the preceding structures and similar structures with multiplexes at any level of the trees, to allow reconfiguration at run time. Moreover, the present principles advantageously describe how to choose among the various possible configurations.

Accordingly, the embodiment of FIG. 5 can be considered to include 3 domains, domain-1 581, domain-2 582, and domain-3 583. Thus, with respect to FIG. 5, we will now describe an example of 2-strata with 3-domains: In this simple example, there are 4 configurations possible:

1. All 3 domains asynchronous
2. Synch nclk0-nclk1, nclk2 asynchronous
3. Synch nclk0-nclk2, nclk3 asynchronous
4. Synch nclk0-nclk1-nclk2

If clock divide-by-2 option is added to the muxes, this grows to 15 configurations as follows:

1. All 3 domains asynchronous
2. Synch nclk0-nclk1 (1:1), nclk2 async
3. Synch nclk0-nclk1 (1:2), nclk2 async
4. Synch nclk0-nclk1 (2:1), nclk2 async
5. Synch nclk0-nclk2 (1:1), nclk3 async
6. Synch nclk0-nclk2 (1:2), nclk3 async
7. Synch nclk0-nclk2 (2:1), nclk3 async
8. Synch nclk0-nclk1-nclk2 (1:1:1)
9. Synch nclk0-nclk1-nclk2 (1:1:2)
10. Synch nclk0-nclk1-nclk2 (1:2:1)
11. Synch nclk0-nclk1-nclk2 (1:2:2)
12. Synch nclk0-nclk1-nclk2 (2:1:1)
13. Synch nclk0-nclk1-nclk2 (2:1:2)
14. Synch nclk0-nclk1-nclk2 (2:2:1)
15. Synch nclk0-nclk1-nclk2 (2:2:2)

FIG. 5 also shows stitchable clock trees/meshes. For example, clock trees/meshes 188 on each stratum can be divided into smaller regions that drive specific macros (e.g., core, memory banks, accelerators, and so forth). Thus, tree A in FIG. 5 can be stitched with tree B on a different stratum or tree C on the same stratum. Advantageously, we can save power by shutting down parts of the chip because, e.g., those parts are not used (idle cores/memory/test specific) and/or those parts do not work or are redundant (reliability). Moreover, we can advantageously shut down regions to meet thermal constraints. Presently, clocks for regions can be enabled or disabled in 2D with clock gating. We propose to use muxable clock buffers to enable segments of the clock tree (L0 buffer) or unconnected regions of the clock mesh (sector buffer) in 3D chips. FIG. 5 also shows mesh data sensors 566 for collecting functional data and performance data. The mesh data sensors 566 are located on different domains of different strata. For example, one sensor 566 is located in domain-1 581 on a bottom stratum, while another sensor 566 is located in domain-2 582 on a top (rightmost) stratum.

Figure 6:
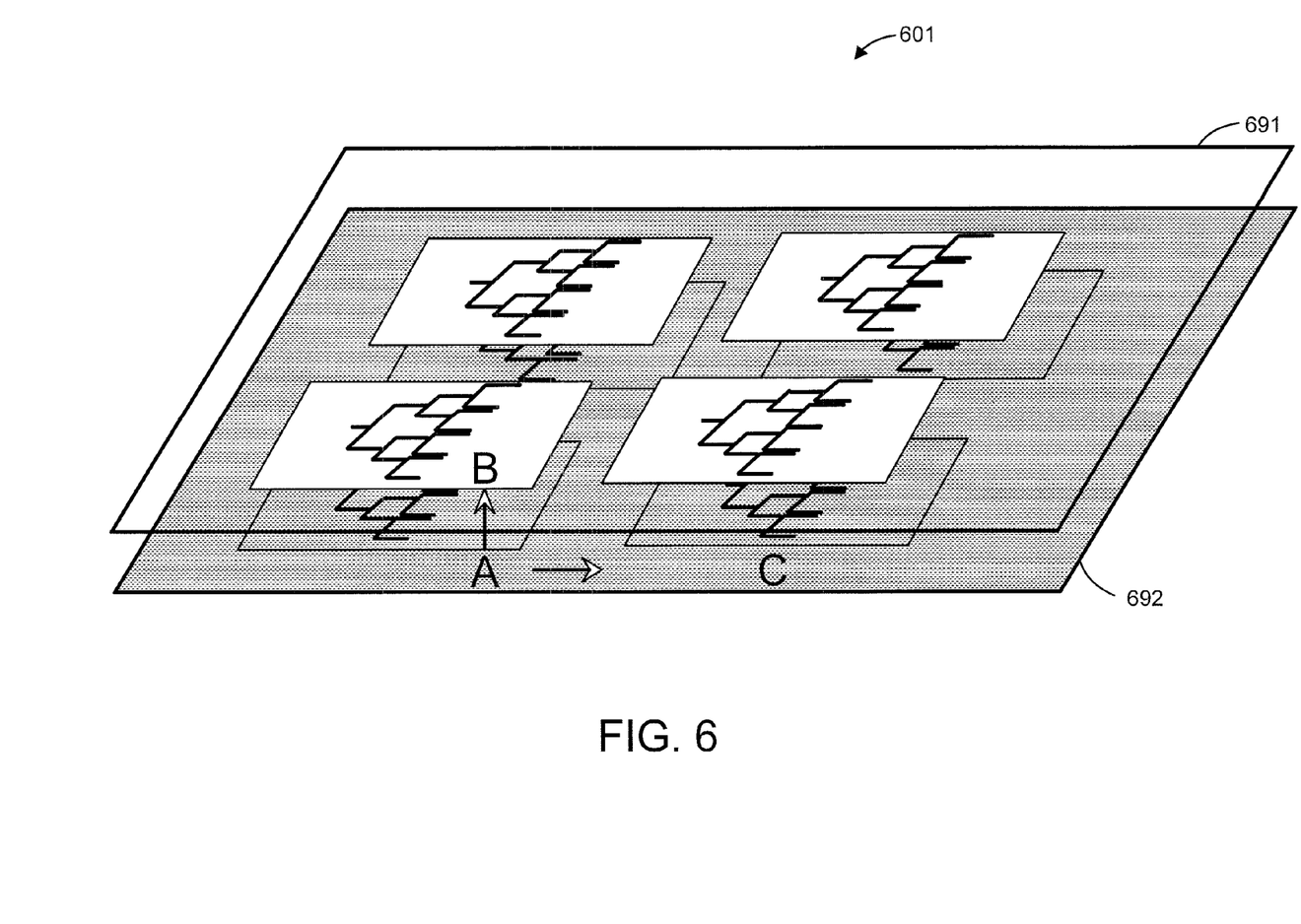
FIG. 6 shows stitchable clock trees 601 arranged on a first stratum 691 and a second stratum 692, in accordance with an embodiment of the present principles.

FIG. 6 shows stitchable clock trees 601 arranged on a first stratum 691 and a second stratum 692, in accordance with an embodiment of the present principles. From among clock trees 601, clock tree A located on second stratum 692 can be stitched with clock tree C on the same stratum (second stratum 692) or clock tree B on a different stratum (first stratum 691).

It is to be appreciated that the first stratum 691 and the second stratum can be configured as dual mode stacked chips capable of operating in a 3D integrated operation mode and an independent operation mode. Operation between these two modes can be readily switched as desired. The 3D integrated operation mode enables high bandwidth communications between strata through vertical interconnects (TSVs, UC4s). The 3D integrated operation mode enables the same vdd/gnd and same frequency to be used with the clocks aligned. The 3D integrated operation mode enables resource sharing between strata.

The independent operation mode allows the strata to be independent of each other and thus, not in synchronous communication with each other. Hence, there is no need for clock alignment between the strata. Communication can be done asynchronously. The independent operation mode enables sharing of vdd/gnd unless there is a regulator on each stratum to generate the supplies. The independent operation mode enables each stratum to be optimized to perform its function in order to save power.

A description will now be given of choosing the best 3D clock configuration for a 3D chip stack, in accordance with an exemplary embodiment of the present principles. In the embodiment, the 3D chip stack has stacks of IP blocks (potentially from different vendors, different corners, variations, and so forth) mapped to clock domains (physical locations, functions, interconnections). The inputs can be one or more of the following: desired functionality; IP blocks available; and measurable minimum cycle time of each IP block. Of course, other inputs can also be used to obtain and/or otherwise affect the output.

In the embodiment, we evaluate the performance of each IP block in a stand-alone configuration. We select a 3D clock configuration from the list of possible configurations based on performance (clock speed) and power. We set the control switches and program the selected 3D clock configuration. We keep alternate configurations in memory to account for performance degradation over time by reprogramming to the alternate configuration when performance drops below a threshold. Given a functional objective, we determine which IP blocks can spatially share a common clock domain (through shorting on different layers). For each stitchable clock domain there exists IP blocks that can be configured with adjacent domains including the top and bottom layers. Clock options between these domains can be synchronous or asynchronous. A data structure can be used to describe the configurations. Hardware knobs, such as, for example, but not limited to, multiplexers, PLLs, and so forth, can be used to implement a desired configuration.

Thus, we have the following as infrastructure components: clocking; pervasives (e.g., pervasive components); and power delivery. To that end, we integrate various building blocks (chiplets) targeted for different design points/clients to meet modular design goals. As used herein, pervasives can include, but are not limited to, components used for system monitoring and debug functions.

The present principles provide stitchable (and/or switchable) clock trees, multiplexed infrastructure components to build a 3D clock tree for different chiplet options. In an embodiment, the baseline design has redundant/configurable components that may be turned on/off/configured when stack characteristics are available. Moreover, the stitchability enables connecting and/or disconnecting various regions/sub-trees.

The present principles can be used with control/feedback loops with DPLL→fclock optimization.

The present principles can be implemented using vertical clock delivery (up/down) or within-stratum clock options.

The present principles can implement e-fuse based customization at single stratum stage (after 3D stack layers are finalized), thus advantageously allowing turning on/off clock trees, components for different stack options.

Infrastructure components or a separate infrastructure layer can be used to enable 3D integration of various chiplets.

Resource borrowing can be employed among layers for maximum efficiency (functional unit sharing, accelerator sharing, cache sharing).

A further description will now be given regarding the infrastructure layer. The infrastructure layer can have multiple clock infrastructures. Moreover, the infrastructure layer can enable the target infrastructure for the selected chiplet.

Further, the infrastructure layer enables smaller regions, which can be stitched to build larger synchs (e.g., islands). Also, the infrastructure layer enables design-time planning and test-time verification of stitchable regions. Additionally, we can run cores A&B in Layer 1&2 synchronously to borrow functional units, fuse resources, and so forth. These and other capabilities of the infrastructure layer are readily determined by one of ordinary skill in the art given the teachings of the present principles provided herein, while maintaining the spirit of the present principles.

The present principles enable choosing best 3D clock configuration. For example, the selection can be based on 3D constraints including, but not limited to, power-distribution limits due to TSV current limits, IR drop, thermal limits due to 3D thermal interactions, and temperature limits, and cycle-time limits due to di/dt noise and 3D I/O limits. Also, the selection can be made based on 3D clocking opportunities such as, but not limited to, over-lapping blocks on different strata achieving very low 3D skew using multiplexes. Further, the selection of clock buffer strengths can be run-time pre-programmed and adaptively adjusted based on readouts from on-chip temperature sensors 566 (see, FIG. 5) placed close to each clock buffer.

A description will now be given regarding the central clock controller, in accordance with an embodiment of the present principles.

In an embodiment, the clock controller can be included in mesh segmentation and joining circuitry or in some other local location with respect to the 3D chip stack. In another embodiment, the clock controller is located externally with respect to the 3D chip stack. In an embodiment, the segmentation and joining circuitry can include, but is not limited to, multiplexed clock buffers.

Before operation, the central clock controller collects data from sensors on the chip on all the mesh sectors and tags each mesh sector with the collected data. Regarding the collected data, the same can include, but is not limited to, functionality of circuits in the mesh sectors, the process corner of each mesh sector, the performance (power and speed) of each mesh sector, and so forth.

During operation, the central clock controller, given system targets and collected data, will configure an optimized system that meets the targets.

The central clock controller can permanently disable non-functional clock sectors, and can only synchronize adjacent meshes that have similar process corners to keep clock skew low.

The central clock controller can select the meshes with the most power efficient circuits, and allows independent meshes to run without synchronizing to adjacent layers if there is not inter-layer communications.

The central clock controller can distribute the processing elements uniformly to avoid hotspots.

Figure 7:
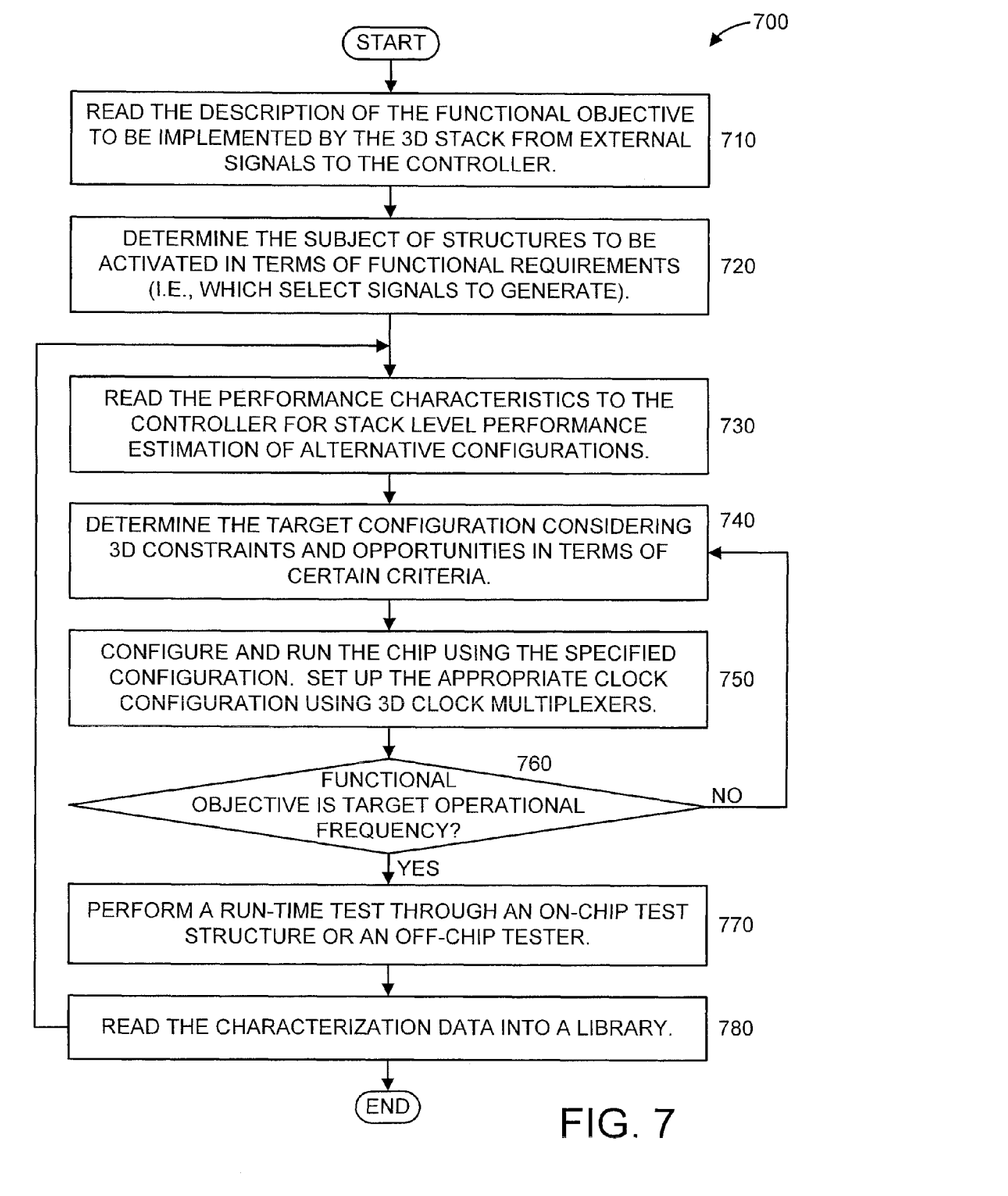
FIG. 7 shows an exemplary method 700 for utilizing a stitchable global clock for a 3D chip stack, in accordance with an embodiment of the present principles.

FIG. 7 shows an exemplary method 700 for utilizing a stitchable global clock for a 3D chip stack, in accordance with an embodiment of the present principles.

At step 710, read the description of the functional objective to be implemented by the 3D stack from external signals to the controller.

At step 720, determine, by the controller, the subject of structures to be activated in terms of functional requirements (i.e., which select signals to generate).

At step 730, read the performance characteristics to the controller for stack level performance estimation of alternative configurations.

At step 740, determine the target configuration considering 3D constraints and opportunities in terms of certain criteria. Such criteria can include, but is not limited to, performance, energy-efficiency, and so forth. In an embodiment, step 740 involves looking up what clock infrastructure component is associated with this target configuration. Moreover, in an embodiment where there are multiple clock infrastructure components, each alternative configuration is registered separately.

At step 750, configure and run the chip using the specified configuration. Set up the appropriate clock configuration using 3D clock multiplexers.

At step 760, determine whether or not the functional objective (read at step 710) is a target operational frequency. If so, then the method proceeds to step 770. Otherwise, the method returns to step 740.

At step 770, perform a run-time test through an on-chip test structure or an off-chip tester.

At step 780, read the characterization data into a library, and return to step 730. The method is terminated when the optimal configuration has been found.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for providing a stitchable clock mesh for a 3D chip stack having two or more strata, the method comprising:
    providing, by at least one clock mesh disposed on each of the two or more strata and having a plurality of sectors, a global clock signal to various chip locations;
    collecting, by mesh data sensors on each of the two or more strata, mesh data for the at least one mesh, the mesh data including measured functional data and measured performance data for a current system configuration; and
    selectively performing, by mesh segmentation and joining circuitry, a segmentation operation or a joining operation on the least one mesh or one or more portions thereof responsive to the mesh data and the current system configuration selectable from a plurality of system target configurations.

2. The method of claim 1, wherein the segmentation operation segments at least a portion of the at least one clock mesh into two or more smaller clock mesh regions.

3. The method of claim 1, wherein the joining operation joins at least two smaller clock mesh regions into one or more larger clock mesh regions.

4. The method of claim 1, wherein the segmentation operation is performed to drive one or more specific macros for the at least one smaller clock mesh region.

5. The method of claim 1, wherein the segmentation operation is performed to shut down power to one or more chip components.

6. The method of claim 1, wherein at least one of the segmentation operation and the joining operation are iteratively repeated until an optimal system configuration is reached from among the plurality of system target configurations responsive to an evaluation of the mesh data.

7. The method of claim 1, wherein the joining operation is performed to power up one or more chip components.

8. The method of claim 1, wherein at least one of the segmentation operation and the joining operation are performed for thermal management.

9. The method of claim 1, wherein mesh segmentation and joining circuitry comprises multiplexed clock buffers.

10. The method of claim 1, wherein the mesh data comprises component functions, a process corner, and performance metrics therefor.

11. The method of claim 1, wherein the at least one mesh or a portion thereof on each of the two or more strata is selectively controlled by a clock controller to operate independently of each other without synchronization there between in a first mode of operation and to operate in synchronization with each other in a second mode of operation.

12. A system for providing a dual operation mode in 3D chip stack having two or more strata, the system comprising:
    an independent operation mode, wherein each of the two or more strata operate independently and without inter-strata synchronous communication there between;
    an integrated operation mode with inter-strata communication between the two or more strata through inter-strata interconnects; and
    a controller for selectively enabling any of the independent operation mode and the integrated operation mode.

13. The system of claim 12, wherein in the independent operation mode, the two or more strata have independent optimization for power savings.

14. The system of claim 12, wherein in the independent operation mode, power supply and ground connections are shared between the two or more strata.

15. The system of claim 12, wherein in the independent operation mode, at least a specific strata frequency and specific strata skew are optimized for each of the two or more strata.

16. The system of claim 12, wherein in the integrated operation mode, power supply connections, ground connections, and one or more frequencies are shared between the two or more strata with global clock alignment across the two or more strata.

17. The system of claim 12, wherein in the integrated operation mode, resource sharing is enabled between the two or more strata.

18. The system of claim 12, wherein a clock source is selected for use on a given one of the two or more strata, from a same one of the two or more strata or an adjacent one of the two or more strata.

19. A method for providing a master clock stratum for a 3D chip stack including two or more strata, the method comprising:
- providing, by a power supply portion, power supplying connections;
- providing, by a clock portion, clock supplying connections;
- performing, by pervasive components, pervasive chip functions; and
- selectively providing, by a controller, to other ones of the two or more strata, at least one of the power supplying connections, clock supplying connections, and the pervasive chip functions.

20. The method of claim 19, wherein said selectively providing step comprises selectively enabling, by said controller, inter-strata pathways through inter-strata connections.

* * * * *